(12) United States Patent
Hanehira et al.

(10) Patent No.: US 6,605,774 B2
(45) Date of Patent: Aug. 12, 2003

(54) PHOTOVOLTAIC DEVICE AND A METHOD OF MANUFACTURING THEREOF

(75) Inventors: Nobuo Hanehira, Tsunagun (JP); Masayoshi Maeba, Sumoto (JP); Toshihiro Nomura, Sumoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/941,842

(22) Filed: Aug. 30, 2001

(65) Prior Publication Data

US 2002/0026956 A1 Mar. 7, 2002

(30) Foreign Application Priority Data

Sep. 1, 2000 (JP) .......................................... 2000-266332

(51) Int. Cl.[7] .............................................. H01L 31/04
(52) U.S. Cl. ........................ 136/256; 136/244; 136/251; 438/64; 438/98
(58) Field of Search ................................ 136/244, 251, 136/256, 259; 438/57, 64, 80, 98, 126

(56) References Cited

U.S. PATENT DOCUMENTS

| | | | |
|---|---|---|---|
| 5,118,362 A | * | 6/1992 | St. Angelo et al. ......... 136/256 |
| 5,421,908 A | * | 6/1995 | Yoshida et al. ............. 136/244 |
| 5,759,291 A | * | 6/1998 | Ichinose et al. ............ 136/256 |
| 6,013,873 A | * | 1/2000 | Daito et al. ................. 136/256 |
| 6,133,521 A | | 10/2000 | Haga et al. ................. 136/256 |

FOREIGN PATENT DOCUMENTS

| | | |
|---|---|---|
| JP | 10-256578 | 9/1998 |
| JP | 2000-286436 | 10/2000 |
| JP | 2001-156310 | 6/2001 |

\* cited by examiner

*Primary Examiner*—Nam Nguyen
*Assistant Examiner*—Brian L Mutschler
(74) *Attorney, Agent, or Firm*—Wenderoth, Lind & Ponack, L.L.P.

(57) ABSTRACT

A photovoltaic device including a photovoltaic module disposed on or above an insulating substrate 10, which is provided with holes 10a, 10d for receiving conducting paste terminals 50a, 50d of the module formed on the substrate 10. A plurality of conducting materials 52 are connected electrically with the conducting paste terminals 50a, 50d, and a protective resin film 82 is provided to protect the terminals. The protective resin film 82 has openings at positions corresponding to the conducting materials 52, and the openings are larger than the topside shape of the conducting materials 52. The conducting materials are disposed inside of the openings.

8 Claims, 12 Drawing Sheets

(a)

(b)

(a)

(b)

(a)

(b)

(a)

(b)

(a)

(b)

(a)

(b)

(a)

(b)

(a)

(b)

(a)

(b)

(a)

(b)

(a)

(b)

PHOTOVOLTAIC DEVICE AND A METHOD OF MANUFACTURING THEREOF

This application is based on application no. 266332 filed in Japan on Sep. 1, 2000, the content of which is incorporated hereinto by reference.

BACKGROUND OF THE INVENTION

1. Technical Field

This invention relates to a photovoltaic device and a method of manufacturing the photovoltaic device.

2. Description of Related Art

A photovoltaic device shown in FIG. 12, which has been developed in advance by the applicant, has a photovoltaic module 200. In this photovoltaic module 200, generating areas A–D are electrically connected in series along their external peripheries. Each of the generating areas has a first electrode layer 20, a light-active semiconductor layer 30 and a transparent conducting layer 40 laminated on an insulating resin substrate 110 such as polyimid. The module 200 has protective resin films 181, 182 such as PET, which are mounted on top and back sides via adhesive layers 183, 184, respectively.

The output of the photovoltaic module 200 is led to output terminals 150a, 150d formed of materials such as conducting paste. The photovoltaic device has the protective resin film 182 having openings 185a, 185d, which lead to the output terminals 160a, 150d in the backside. The openings 185a, 185d are filled with conducting materials 152,152 such as conducting paste. The conducting materials 152,152 are disposed on the surface of the protective resin film 182 and on the periphery of the openings 185a, 185d.

In the related photovoltaic device mentioned above, after completion of the device, it can occur that the outputs from the backside conducting materials 152 are nothing or low. Such a defect has been proved to be due to disconnection(s) inside of the conducting materials 152.

The reason for the disconnection is as follows. The conducting materials 152 are formed by heat-drying at approximately 150° C., after patterning original material such as conducting paste with screen printing. The conducting paste as the original materials includes binder such as polyimide, phenolic or epoxy binder, and conducting powder such as silver, nickel, carbon or aluminum etc. The conducting materials 152 are disposed through materials having different thermal expansion, such as the substrate 110, the adhesive layer 184 and the protective resin film 182. Accordingly, in a heat-drying process, each of the materials expands, and when the materials cool back to room temperature, each of the materials contracts, so that the conducting materials 152 are subjected to stress. This stress makes the conducting materials 152 partially crack. The crack breaks the conductivity between the conducting powders and causes the conducting materials to become disconnected.

In addition, the conducting material can be subjected to stress due to expansion in a heating state under sunshine, and contraction in a low-temperature state in the night or the like, and thus the conducting materials 152 can disconnect even during operation.

SUMMARY OF THE INVENTION

This invention was developed to solve the above described types of problems, it is thus an object of the present invention to provide a photovoltaic device and a method of manufacturing the device, in which conducting materials for leading an output to the outside will.be less likely to become disconnected.

A photovoltaic device of the present invention comprises a photovoltaic module that is disposed on or above an insulating substrate, a conducting material electrically connected with an output terminal of the photovoltaic module and disposed on one facet side of the substrate, a protective layer covering the facet side of the photovoltaic module. The protective layer has opening positioned so as to face the conducting material, and the opening is larger than the shape of the facet side of the conducting material.

A method of manufacturing of a photovoltaic device of the present invention comprises a process step of forming a hole in an insulating substrate connected with an output terminal of a photovoltaic module formed on an insulating resin substrate, a process step of disposing a conducting material in a backside of the substrate to connect with the output terminal electrically via the hole, and a process step of forming a protective layer having an opening at a position facing the conducting material in the topside of the substrate, which is larger than the shape of backside of the conducting material.

In the photovoltaic device mentioned above, the photovoltaic device has the substrate and the protective layer, and even if the substrate and the protective layer are formed of materials having different thermal expansion, the conducting materials are disposed inside of the opening of the protective layer, so that expansion or to contraction of the protective layer does not stress the conducting materials when the expansion or contraction occurs during use of the photovoltaic device. Therefore the conducting materials are less likely to become disconnected.

In addition, in the method of manufacturing of the invention, the conducting materials are formed before the protective layer is formed. For example, when a conducting paste is used as the conducting material, printing and heat-drying are employed. The conducting material is formed before forming the protective layer, so that the problem of the related art device mentioned above does not occur. In the related art device, expansion or contraction of the protective resin film, such as the protective layer due to heating or forming the conducting materials, causes the conducting materials to become disconnected.

The above and further objects and features of the invention will more fully be apparent from the following detailed description taken in conjunction with the accompanying drawings.

DETAILED DESCRIPTION OF THE PREFERRED EMBODIMENTS

The following describes in detail a first embodiment of the structure of a photovoltaic device and a method of manufacturing the photovoltaic device with reference to FIGS. 1 through 8. First, the structure of the photovoltaic module, which is formed on a substrate, and the method of manufacturing will be described with reference to FIGS. 1 through 6. Then the conducting materials and the protective resin film as the protective layer having an opening, which are features of the present invention, are described with reference to FIGS. 7 and 8.

First turning to FIGS. 1a and 1b, a substrate 10 used in this embodiment is shown. As shown in FIG. 1(a), the substrate 10 is a flexible rectangular film substrate made of resin such as polyimide (coefficient of expansion $10 \times 10^{-6}$ cm/cm/° C.) etc. In FIG. 1(a), substrate regions encircled with alternate long and single dotted lines 11, 11, . . . are respectively regions in which photovoltaic devices are formed. FIG. 1(b) shows the area located in the lower left corner of the substrate 10. Regions A through D, which are delineated by alternate long and double dotted lines in FIG. 1(b), are power generating regions. Each of the power generating regions include a stacked layered body formed of a first electrode layer, a light-active semiconductor layer, and a transparent conducting layer as described below. Finally, AT is the positive electrode terminal area and DT is the negative electrode terminal area.

FIGS. 2 through 8 show the method of manufacturing the photovoltaic device that is located near the lower left corner of the substrate 10. Since the method of manufacturing each of the other photovoltaic devices is the same as that shown in FIGS. 2 to 8, their description is omitted.

Figure 2:
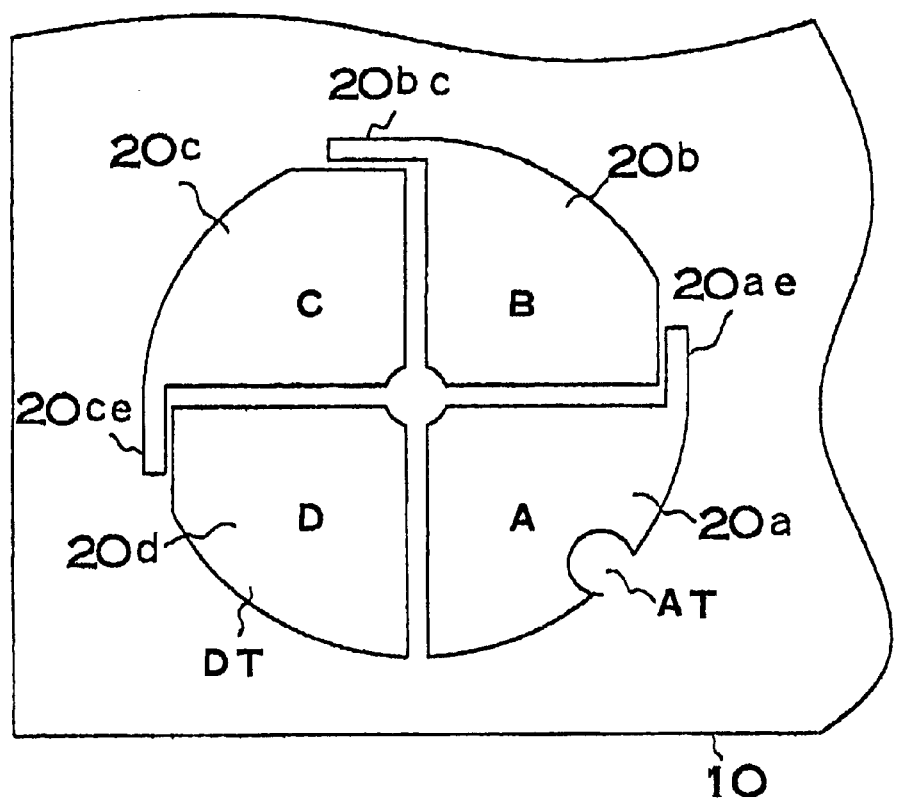
FIG. 2 is a plan view showing a first process step of a first embodiment of the present invention.

Turning to the process step shown in FIG. 2, the first electrode layer forms fan-shaped sectors 20a through 20d corresponding to the power generating regions A through D, respectively. The fan-shaped sectors 20a through 20d are each formed with a central angle of approximately 900. The fan-shaped sectors 20a through 20d are disposed with spaces of prescribed width between them and form a circular shape as a whole. Further, each of the fan-shaped sectors 20a, 20b, and 20c has a connecting region 20ae, 20be, and 20ce which extends outside the periphery of the adjacent power generating region B, C, and D, respectively. The fan-shaped sectors 20a through 20d have a thickness from 0.1 μm to 1.0 μm, and are made of metal films such as tungsten, aluminum, titanium, nickel, or copper, etc. In addition, the fan-shaped sector 20d of the first electrode layer extends into the negative electrode terminal area DT. Conversely, the first electrode layer is not disposed in the positive electrode terminal area AT.

Figure 3:
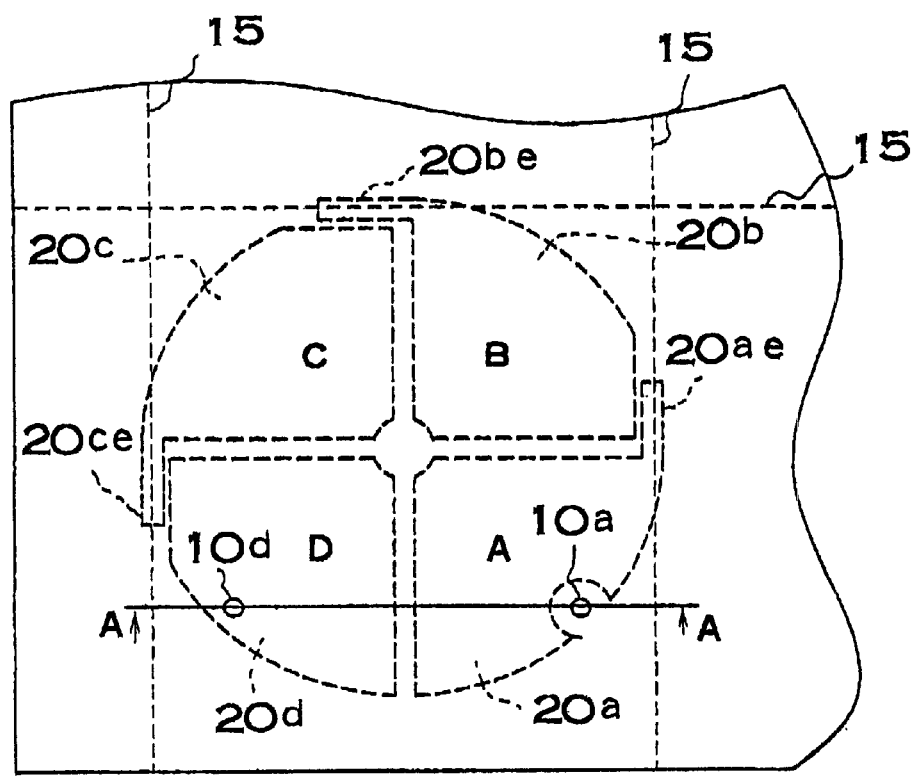
FIG. 3(a) is a plan view showing a second process step of the first embodiment of the present invention.
FIG. 3(b) is a cross-sectional view taken at section line A—A in FIG. 3(a).
Figure 3:
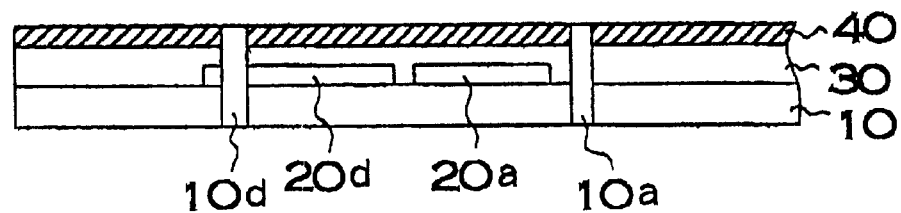

Next, in the process step shown in FIG. 3, the light-active semiconductor layer 30, which is a pn or pin-type layered-structure formed of amorphous silicon, amorphous silicon-carbide, or amorphous silicon-germanium, etc., is formed over most of the substrate 10 with a thickness from 0.3 μm to 1.0 μm. Subsequently, a transparent conducting film 40, which constitutes the transparent conducting layer described below, is formed over most of the light-active semiconductor layer 30. This transparent conducting film 40 is a transparent conducting film of zinc oxide (ZnO), indium tin oxide (ITO), or tin oxide ($SnO_2$), etc. with a thickness from 0.3 μm to 1.0 μm.

Figure 1:
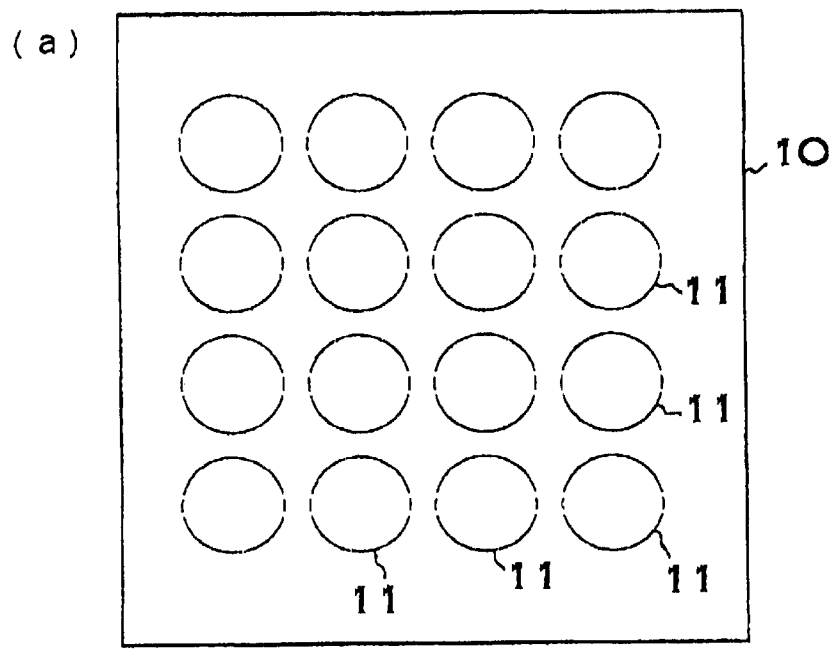
FIGS. 1a and 1b are plan views showing a substrate used for the present invention.
Figure 1:
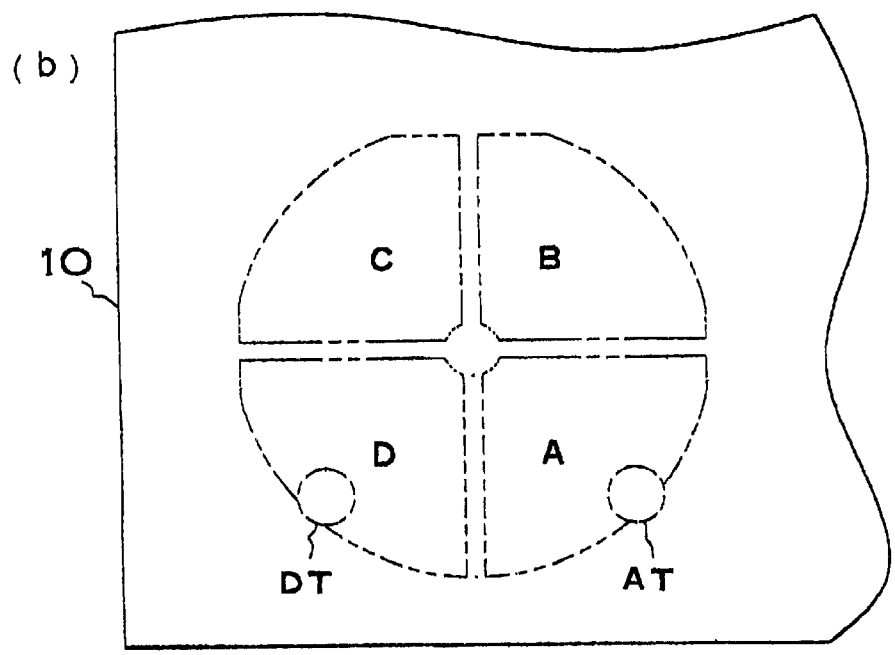

Each of the first electrode layer.connecting regions 20ae, 20be, and 20ce are next laser-welded and electrically connected to the transparent conducting film 40 by linearly scanning a YAG laser (1.06 μm wavelength) parallel to the sides of the substrate 10 and positioned over the transparent conducting film 40 above the first electrode layer connecting regions 20ae, 20be, and 20ce. The laser-welded regions are in the form of spots approximately 50 μm to 80 μm in diameter, and they are shown as dotted line 15 in FIG. 3. Since the photovoltaic devices at this process step of the present embodiment are positioned on the substrate 10 in the regions 11, 11, . . . as shown in FIG. 1, the connecting regions of the first electrode layer and the transparent conducting film 40 for all other photovoltaic devices being processed are electrically connected by linear scanning of the YAG laser as described above. Instead of the YAG laser being linearly scanned, a laser device capable of spot irradiation only over the first electrode layer connecting regions 20ae, 20be, and 20ce can be used to laser-weld and electrically connect the electrodes.

In addition, circular shape holes 10a, 10d with a diameter of approximately 0.1 mm, which penetrate through the substrate 10, the light-active semiconductor layer 30 and the transparent conducting layer 40 etc., are formed by irradiating energy beam such as YAG laser from the topside of the substrate 10. If necessary, in negative terminal area DT, a first electrode layer 20d and a transparent conducting layer 40dt, which are disposed facing each other via a light-active semiconductor layer 30, are welded by energy beam such as YAG laser.

Figure 4:
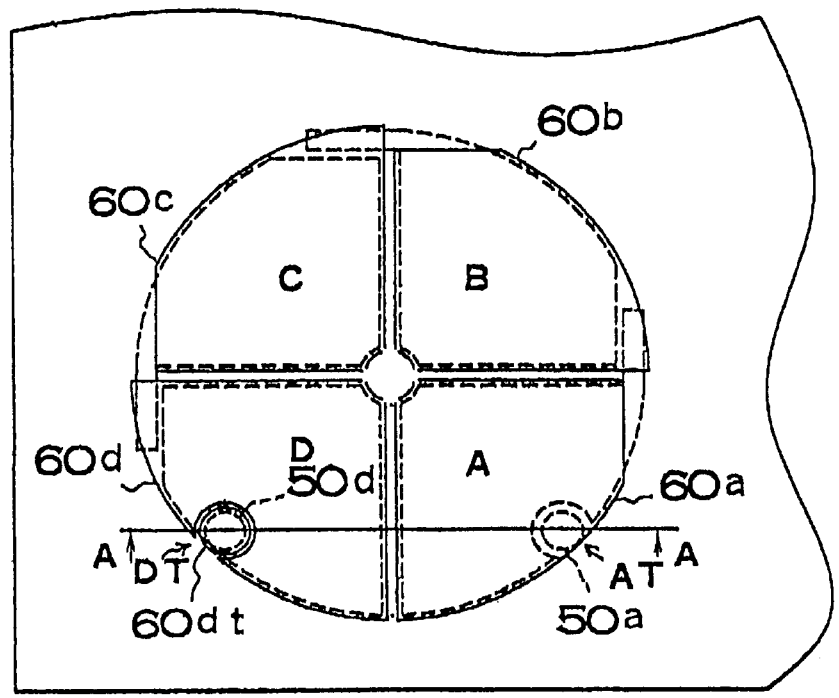
FIG. 4(a) is a plan view showing a third process step of the first embodiment of the present invention.
FIG. 4(b) is a cross-sectional view taken at section line A—A in plan FIG. 4(a).
Figure 4:
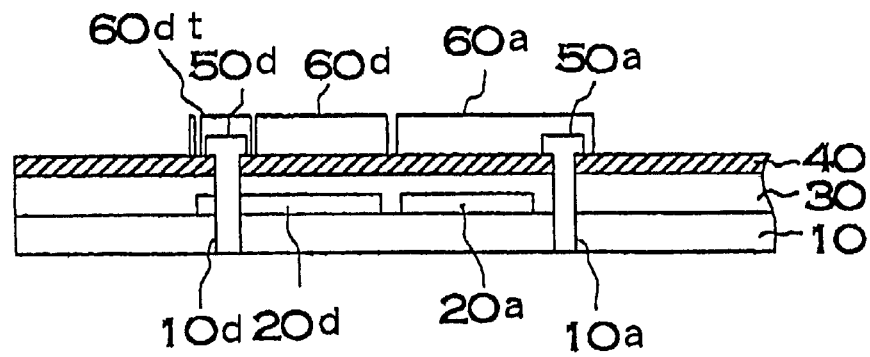

Next in the process step shown in FIG. 4, conducting paste electrodes 50a and 50d, which are output terminals of the photovoltaic module, are formed over the transparent conducting film 40 in the positive electrode terminal area AT and the negative electrode terminal area DT, respectively. These conducting paste electrodes 50a and 50d are formed by the following screen printing method. The conducting paste is a polyimide, phenol, or epoxy based binder which includes a conducting powder such as silver, nickel, or aluminum, etc. . After patterning the electrode terminals of the conducting paste by screen printing, the conducting paste is baked dry at 150° C., a film of the conducting paste typically 10 µm to 20 µm in height is formed. And the conducting paste materials are disposed inside of the holes 10a, 10d shown in FIG. 4 by this screen printing method.

Next, patterned transparent protective layers 60a through 60d, which can be passed by visible light but not by ultraviolet light, are disposed over the transparent conducting film 40 corresponding to each of the power generating regions A through D. Further, the patterned transparent protective layer 60a extends over the electrode terminal area AT, and in the electrode terminal area DT a transparent protective layer 60dt having an approximately circular shape is disposed separately from the transparent protective layer 60d. The transparent protective layers are patterned by screen printing and heat-drying the starting materials of polyethylene terephthalate (PET) resin (approximately 3 µm to 6 µm in layer thickness). Gap widths between the adjacent patterned transparent protective layers are desirably greater than or equal to approximately 0.2 mm, and are set at approximately 0.4 mm in this embodiment.

Figure 5:
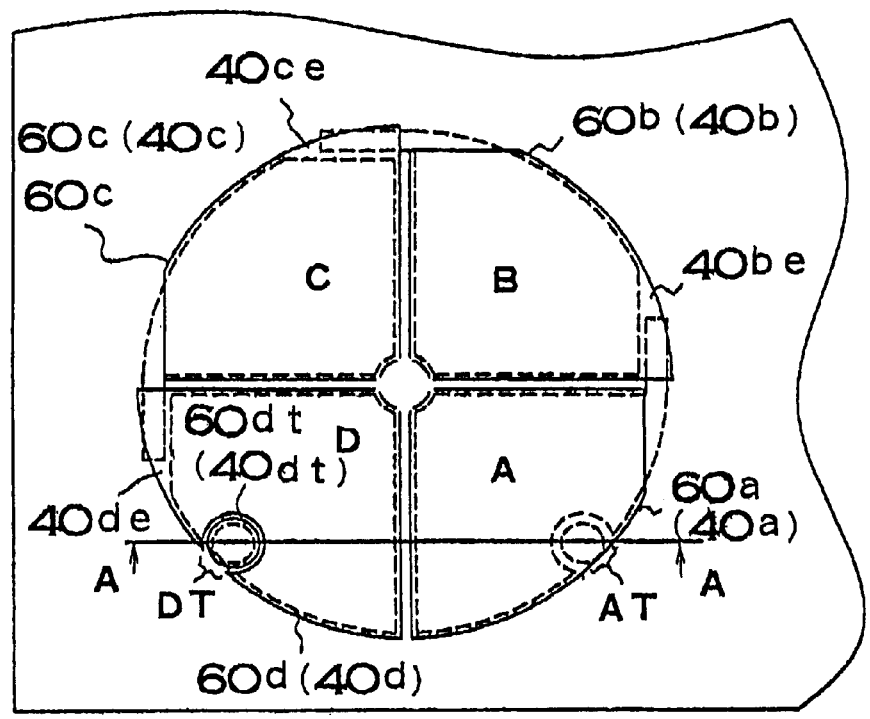
FIG. 5(a) is a plan view showing a fourth process step of the first embodiment of the present invention.
FIG. 5(b) is a cross-sectional view taken at section line A—A in plan FIG. 5(a).
Figure 5:
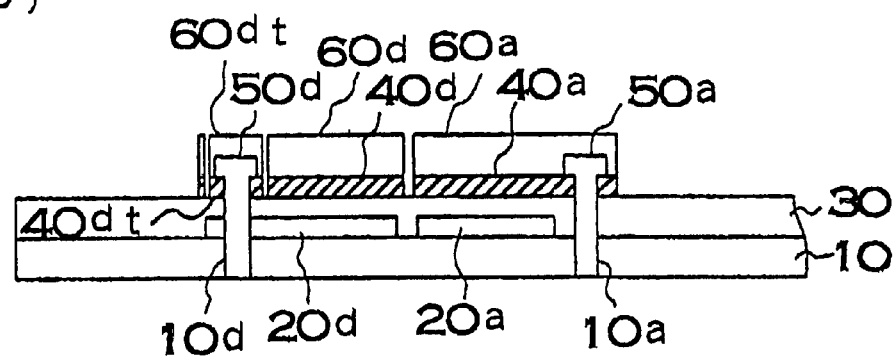

Next in the process step shown in FIG. 5, a sheet-beam of ultraviolet laser light, which is a sheet-beam of eximer laser (KxF laser, 249 nm) light, is scanned over the substrate 10 to irradiate it over most of the substrate surface.

As a result of this process step, exposed portions of the transparent conducting film 40, which are not covered by the transparent protective layers 60a through 60d and 60dt being visible light transparent and ultraviolet light blocking, are removed. Transparent conducting layers 40a through 40d and 40dt are thereby formed so as to correspond to each of the transparent protective layers 60a through 60d and 60dt. Here, eximer laser parameters are set considering scanning speed and width of the sheet-beam etc. so as to sufficiently remove exposed portions of the transparent conducting film 40. In this embodiment, ITO of about 700 Å, was used for the transparent conducting film 40, and exposed ITO transparent conducting film 40 could be sufficiently removed with KrF laser parameters of 1.0 to 1.6 J/pulse output, 150 mm sheet-beam length, 0.4 mm sheet-beam width (i.e. 0.017–0.027J/pulse·mm², 30 Hz pulse rate, and 12 mm/sec scanning speed.

The transparent conducting layers 405, 40c, and 40d have connecting regions 40be, 40ce, and 40de facing the first electrode layer connecting regions 20ae, 20be, and 20ce, respectively through the lightactive semiconductor layer 30. Each of these connecting regions 40be, 40ce, and 40de is electrically connected to the adjacent first electrode layers by welding in the process step shown in FIG. 3.

Figure 6:
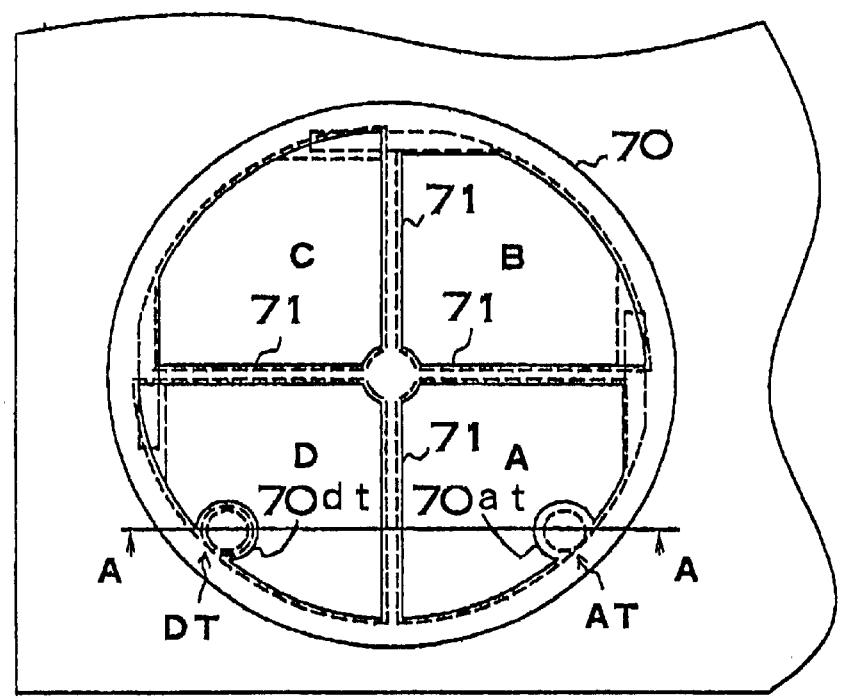
FIG. 6(a) is a plan view showing a fifth process step of the first embodiment of the present invention.
FIG. 6(b) is a cross-sectional view taken at section line A—A in plan FIG. 6(a).
Figure 6:
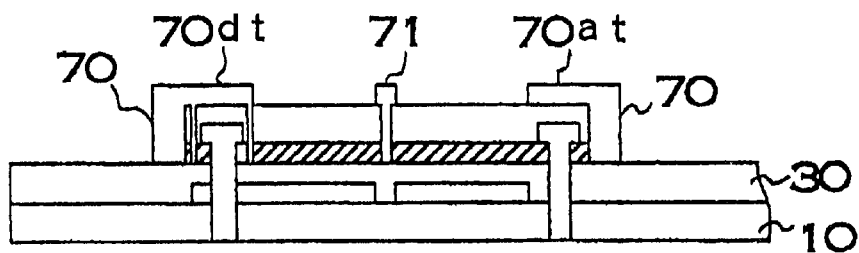

Next in the process step shown in FIG. 6, protective materials 70, 71, 70at, and 70dt in gaps between each of the power generating regions A through D and over the terminal areas AT and DT are formed by screen printing. Resin such as acrylic or polyethylene terephthalate (PET) with film thickness 2 µm to 10 µm can be used as the protective materials resin. The protective materials may be either transparent or provided with coloration. When brownish color is added to the protective materials, it has the same type of coloration as the amorphous silicon light-active semiconductor layer 30 and color contrast over the light-receiving surface of the photovoltaic device can be reduced. This can result in a pleasing external appearance when the photovoltaic device is used as a power source for a watch or clock.

The photovoltaic module has been formed on the substrate 10 by the process steps described above.

Figure 7:
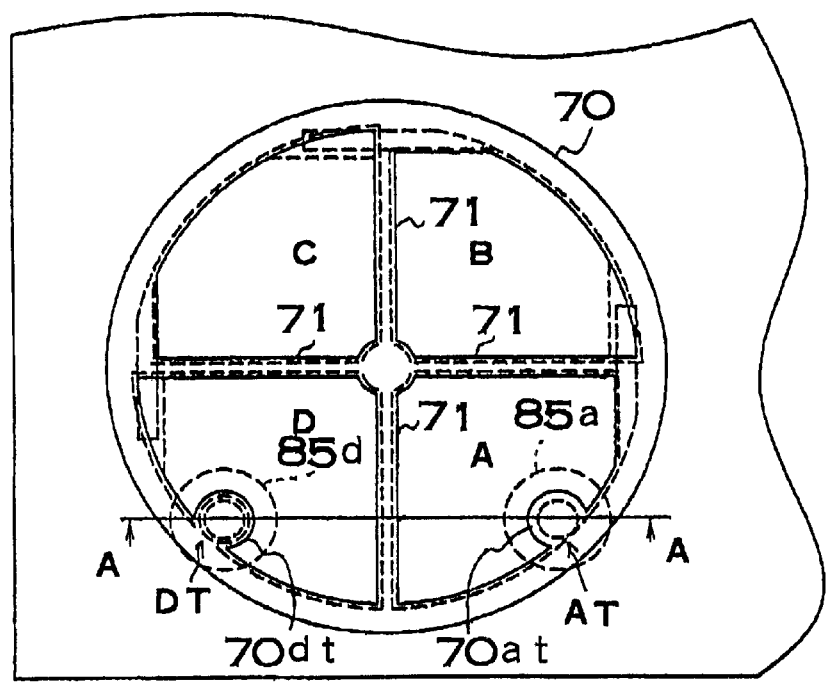
FIG. 7(a) is a plan view showing a sixth process step of the first embodiment of the present invention.
FIG. 7(b) is a cross-sectional view taken at section line A—A in plan FIG. 7(a).
Figure 7:
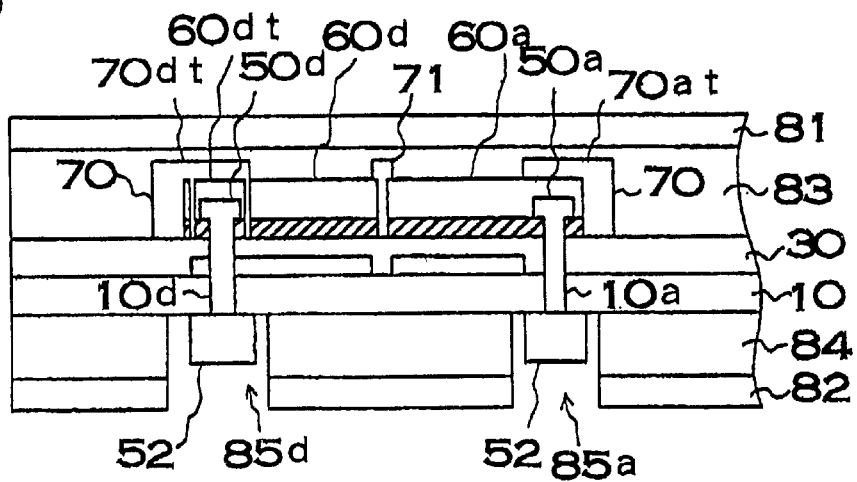
Figure 8:
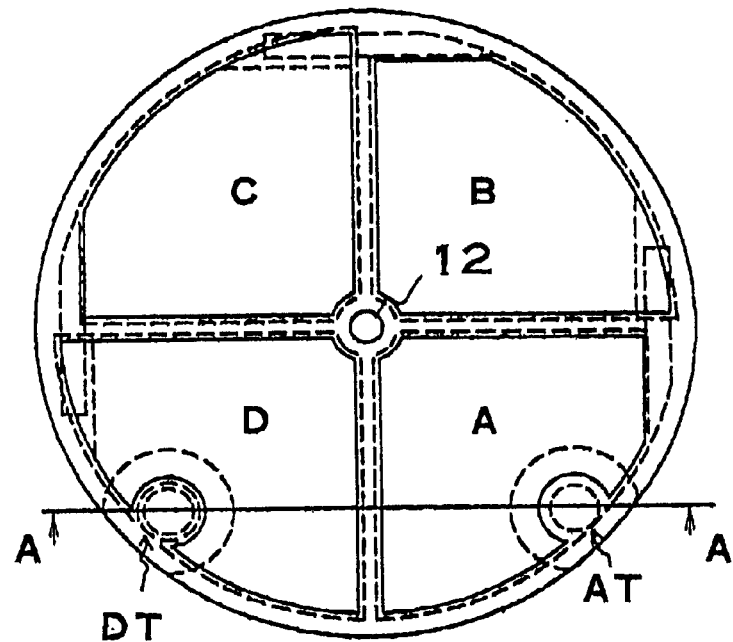
FIG. 8(a) is a plan view showing a seventh process step of the first embodiment of the present invention.
FIG. 8(b) is a cross-sectional view taken at section line A—A in plan FIG. 8(a).
Figure 8:
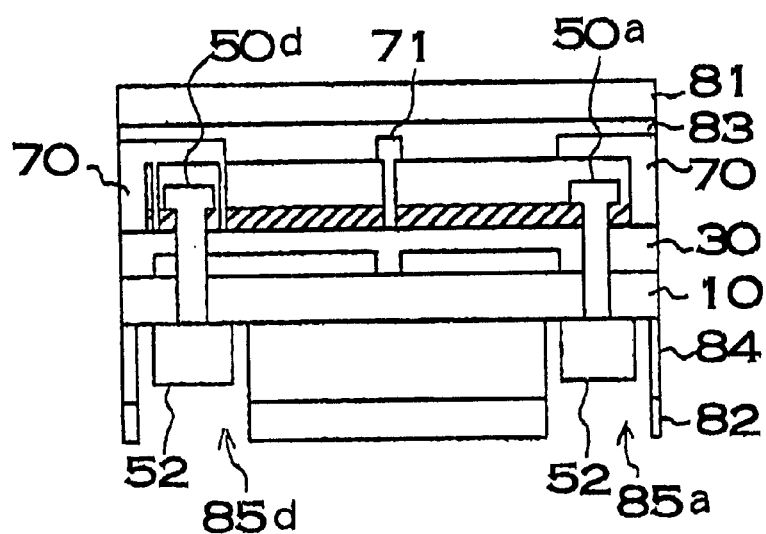

Next, the conducting materials and the protective resin film as the protective layer having the opening, which are features of the invention, are described with reference to FIG. 7 and FIG. 8. In a process step shown in FIG. 7, first, a transparent topside protective resin film 81 is formed as a protective layer above the surface of the substrate 10. The protective resin film 81 is a film body having a film thickness of approximately 25 µm to 1000 µm, which is made of polyethylene terephthalate (=PET, coefficient of expansion $17 \times 10^{-6}$ cm/cm/° C.) etc. An adhesive layer 83 with film thickness approximately 20 µm to 100 µm, which is made of thermoplastic resin such as ethylene-vinyl acetate copolymer (=EVA, coefficient of expansion 110 to $220 \times 10^{-6}$ cm/cm/° C.) is attached to the one side surface of the protective resin film 81. The protective resin film 81 is laminated by being passed through heat rollers. In particular, PET with film thickness 50 µm is employed as the topside protective resin film 81.

Subsequently, the conducting materials 52 are formed of conducting paste, which is disposed from the backside on the holes 10a, 10d and the periphery of the holes of the back surface of the substrate 10. The conducting materials 52 are formed by heat-drying at approximately 150° C., after patterning original materials, which are binder such as polyimide, phenolic or epoxy binder including conducting powder such as silver, nickel, carbon or-aluminum etc., by screen printing. Each of the conducting materials 52 are circular in shape with a diameter of approximately 1.2 mm in the view from the backside.

Then, the film shaped transparent backside protective resin film 82 as the protective layer is formed above the whole back surface of the substrate 10. The protective resin film 82 is a film body with a film thickness of approximately 26 µm to 1000 µm, and the film body is made of polyethylene terephthalate (=PET, coefficient of expansion $17 \times 10^{-6}$ cm/cm/° C.) etc. An adhesive layer 84, with a film thickness of approximately 20 µm to 100 µm, is made of thermoplastic resin such as ethylene-vinyl acetate copolymer (=EVA, coefficient of expansion 110 to $220 \times 10^{-6}$ cm/cm° C.) and is attached onto the one side surface of the protective resin film 82. The protective resin film 82 is laminated by passing.through heat rollers. In particular, PET, with a film thickness of 25 µm is employed as the backside protective resin film 82.

Then the backside protective resin film 82 defines circular openings 86a, 86d with a diameter of approximately 3 mm, which are larger than the backside circular shape of the conducting materials 62 projecting from the backside of the substrate 10. The diameter of the backside shape in the projecting portion of the conducting materials 52 projecting from the substrate 10 toward backside is approximately 1.2 mm in diameter. This results in the conducting materials 52 being disposed inside of the openings 86a, 86d.

Subsequently, the external periphery of the resin materials 70 disposed periphery portion of the power generating regions A through D is cut-out by a Thomson type cutter etc. As described above, each of the photovoltaicdevices shown in FIG. 8 is accomplished from the substrate 10. While an opening hole 12 is formed by cutting out a center portion of the photovoltaic device. When the photovoltaic device is used as a power source for a watch or clock, the hole 12 can be used as a through hole for receiving an axis of pointers of the watch or the clock.

In the first embodiment of the photovoltaic device and the method of manufacturing, even if the substrate 10, the adhesive layer 84 and the protective resin film 82, which are different thermal expansion materials, are employed, the conducting materials 52 can be less disconnected. This is because the conducting materials 52 are disposed inside of the openings 85a, 85d of the protective resin film 82, so that the expansion or contraction of the protective layers do not make the conducting materials stress when the expansion or contraction occurs. In addition, in the first embodiment of the method of manufacturing, the conducting materials 52 are formed by printing the conductive paste and then dry-heating, before the protective resin film 82 is formed, so that the problem of disconnected conducting materials does not occur. As discussed above, in the related art expansion or contraction of protective resin film 82 by heating or forming the conducting materials causes the conducting materials 20 to become disconnected.

Next, the following describes in detail a second embodiment of the present invention. In the first embodiment described above, the conducting materials 52 are disposed to output from the backside, whereas in the second embodiment, its structure is to output from the topside. The following describes in detail the second embodiment of the present invention with reference to FIGS. 9 and 10. In the second embodiment, approximately the same structure and method of manufacturing the first embodiment, as shown in FIG. 1 to FIG. 6 are employed; except circular shape holes 10a, 10d are provided at the step shown in FIG. 3. Furthermore, in FIGS. 9 and 10, each element is referenced with a number having two lower digits that correspond to the reference number used to identify the same element of the first embodiment.

Figure 9:
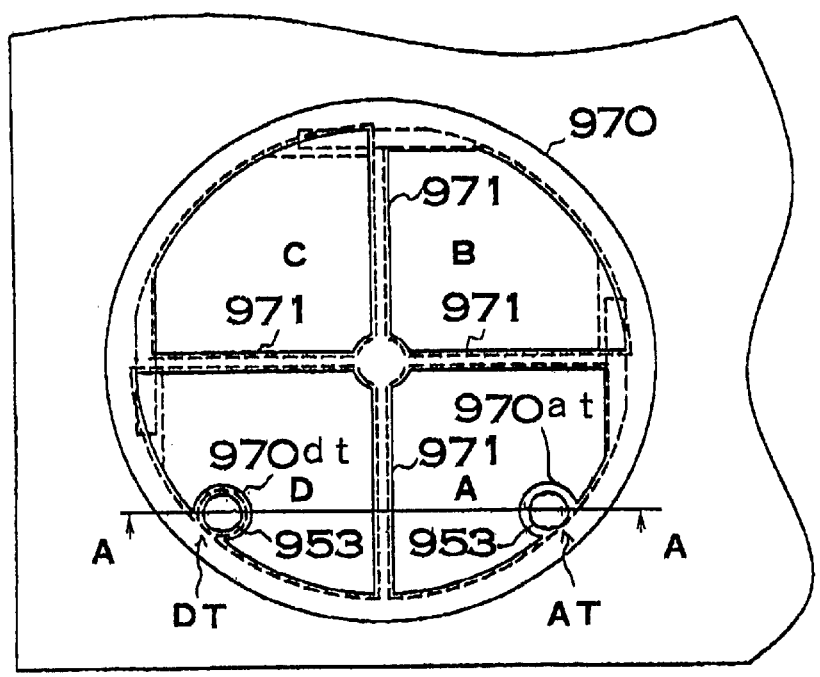
FIG. 9(a) is a plan view showing a process step of a second embodiment of the present invention.
FIG. 9(b) is a cross-sectional view taken at section line A—A in plan FIG. 9(a).
Figure 9:
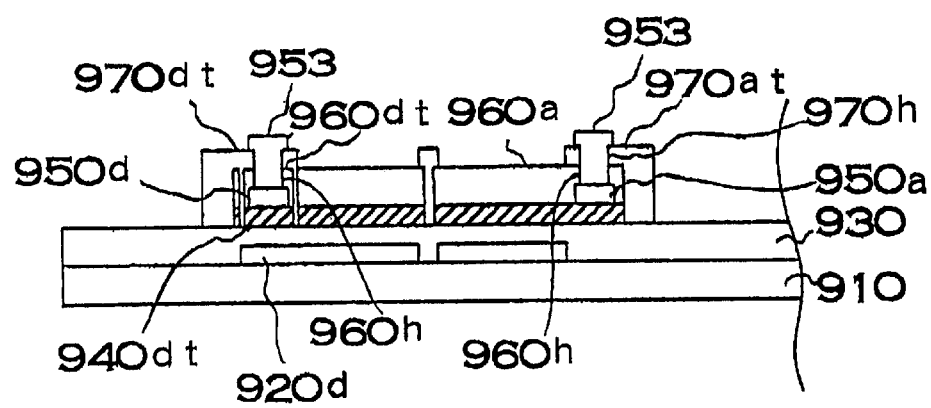

Here, the following structure is different from the first embodiment, an intermediate body shown in FIG. 9 is manufactured. As shown in FIG. 9, a transparent protective layer 960a has an opening 960h formed with a diameter of approximately 1 mm at a conducting paste terminal 950a. A transparent protective layer 960dt has opening 960h with a diameter of approximately 1 mm at a conducting paste terminal 950d. Protective material 970at has opening 970h and protective material 970dt has opening 970h to connect with the openings 960h. Accordingly, the conducting paste terminals 950a, 960d are exposed at the upper side of a substrate 910. In addition, in negative terminal area DT, a first electrode layer 920d and a transparent conducting layer 940dt, which are disposed so as to face each other via a light-active semiconductor layer 930, are welded by energy beam such as YAG laser, before forming the conducting paste terminal 950d.

Subsequently, conducting materials 953, which are made of conducting paste, are disposed inside of the holes 960h, 970h and on a periphery of the holes of the protective materials 970at and 970dt from the top side. The conducting materials 953 include binder such as polyimide, phenolic or epoxy binder, and conducting powder such as silver, nickel, carbon oraluminum etc. The conducting pastes are formed by heat-drying at approximately 150° C. after patterning by screen printing. Each of the conducting materials 953 are circular shaped with a diameter of approximately 1.2 mm in the view from the top side, and can be disposed inside of the holes 960h, 970h by the screen printing process.

Figure 10:
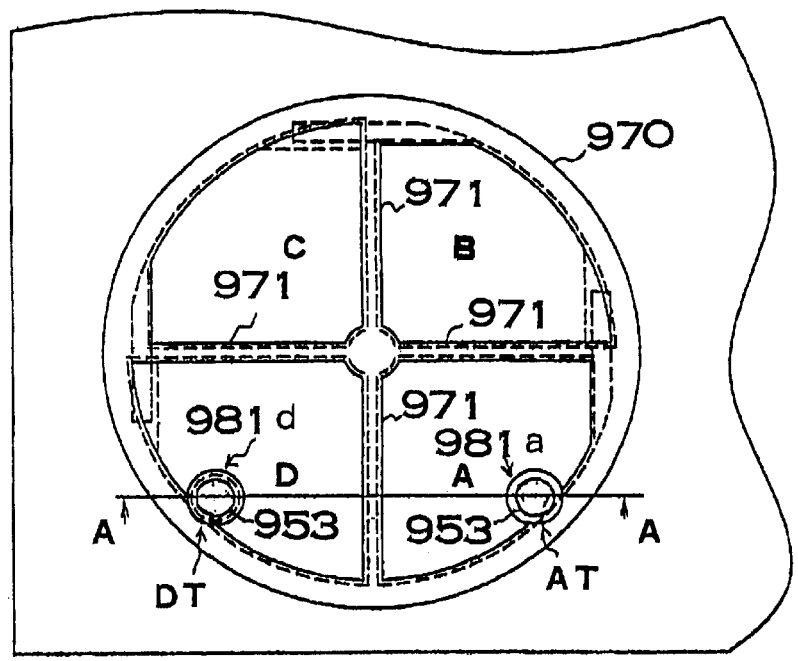
FIG. 10(a) is a plan view showing a next process step of the second embodiment of the present invention.
FIG. 10(b) is a cross-sectional view taken at section line A—A in plan FIG. 10(a).
Figure 10:
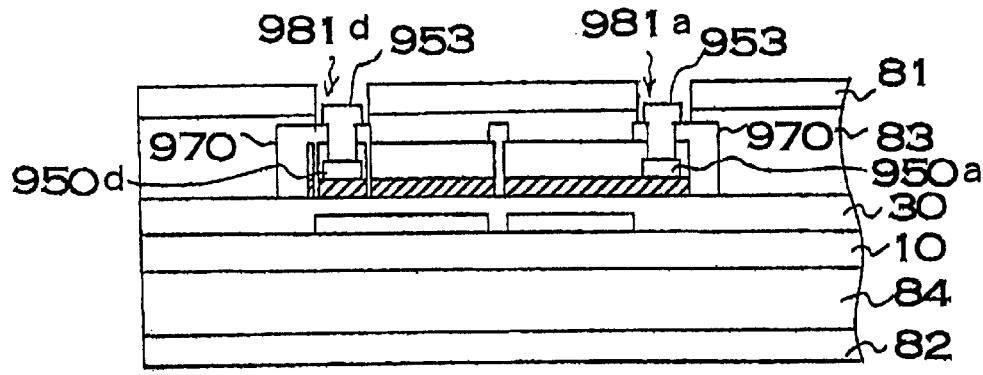

Next, in process step shown in FIG. 10, a film shaped transparent topside protective resin film 981 as the protective layer is formed above a surface of the substrate 910. The protective resin film 981 is a film body with a film thickness of approximately 25 $\mu$m to 1000 $\mu$m, which is made of polyethylene terephthalate (=PET, coefficient of expansion $17 \times 10^{-6}$ cm/cm/° C.) etc. An adhesive layer 983 with a film thickness of approximately 20 $\mu$m to 100 $\mu$m, which is made of thermoplastic resin such as ethylene-vinyl acetate copolymer (=EVA, coefficient of expansion 110 to $220 \times 10^{-6}$ cm/cm/° C.) and is attached onto one side surface of the protective resin film 981. The protective resin film 981 is laminated by passing through heat rollers. In more detail, PET with a film thickness of 50 $\mu$m is employed as the topside protective resin film 981.

Then, the topside protective film 981 has the circular shaped openings 981a, 981d with diameter approximately 2 mm in advance, which are larger than the topside shape of the upper portion of the conducting materials 953, at the position facing the conducting materials 953 as shown in the figures. The diameter of the topside shape of the conducting materials 953 is approximately 1.2 mm, and the diameter of the openings 981a, 981d is approximately 2 mm. According to this structure, the conducting materials 953 are disposed inside of the openings 981a, 981d. Next, the film shaped transparent backside protective resin film 982, which is the protective layer, is formed above the whole back surface of the substrate 910. The protective resin film 982 is a film body with a film thickness of approximately 25 $\mu$m to 1000 $\mu$m, and is made of polyethylene terephthalate (=PET, coefficient of expansion $17 \times 10^{-6}$ cm/cm/° C.) etc. An adhesive layer 984 with a film thickness of approximately 20 $\mu$m to 100 $\mu$m, which is made of thermoplastic resin such as ethylene-vinyl acetate copolymer (=EVA, coefficient of expansion 110 to $220 \times 10^{-6}$ cm/cm/° C.) is attached onto the one side surface of the protective resin film 982. The topside protective resin film 982 is laminated by passing through heat rollers. In more detail, PET with a film thickness of 25 $\mu$m is, employed as the topside protective resin film 982.

Subsequently, as in the first embodiment shown in FIG. 8, an external periphery of the resin material 970 disposed periphery portion of the power generating regions A through D is cut-out by a Thomson type cutter or the like in order to make the photovoltaic device of the second embodiment. As described above, each of the photovoltaic devices is accomplished from the substrate 910. While an opening hole is formed by cutting out the center portion of the photovoltaic device. When the photovoltaic device is used as a power source for a watch or clock, the hole can be used to receive the axis for pointers of the watch or the clock.

In the second embodiment of the photovoltaic device and the method of manufacturing described above, even if the substrate 910, the adhesive layer 983 and the protective resin film 981, which have different thermal expansions, are employed, the conducting materials 953 can be less disconnected. This is because the conducting materials 953 are disposed inside of the openings 981a, 981d of the protective resin film 981, so that the expansion or contraction of the protective layer does not make the conducting materials stress when expansion or contraction occurs during operation. In addition, in the second embodiment of the method of manufacturing, the conducting materials 953 are formed by printing conductive paste and then dry-heating, before the protective resin film 981 is formed, so that the problem experienced in the related art device does not occur. As mentioned above, in the related art device, expansion or contraction caused by heating or forming the conducting materials can result in the conducting materials becoming disconnected.

Figure 11:
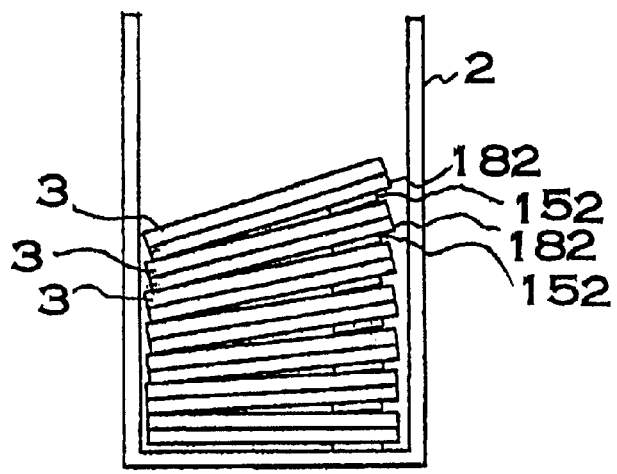
FIG. 11(a) is a cross-sectional view of a schematic illustration of photovoltaic devices, which were previously developed by the present applicant, in a packing container.
FIG. 11(b) is a cross-sectional view showing the photovoltaic devices of the invention in a packing container.
Figure 11:
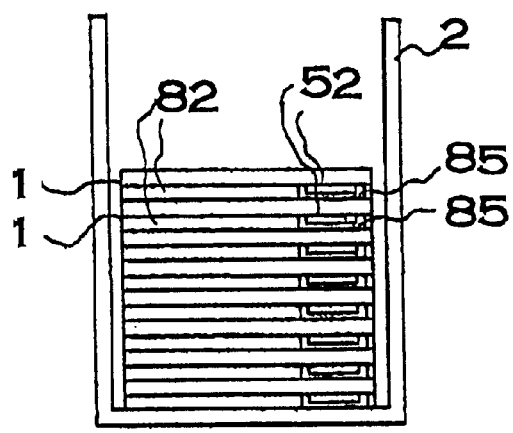
Figure 12:
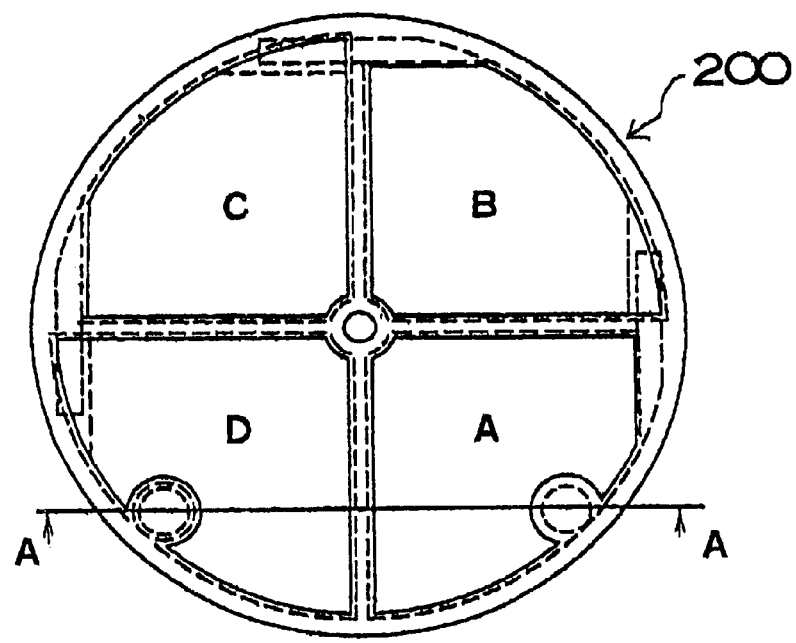
FIG. 12(a) is a plan view showing the photovoltaic device that was previously developed by the present applicant.
FIG. 12(b) is a cross-sectional view taken at section line A—A in FIG. 12(a).
Figure 12:
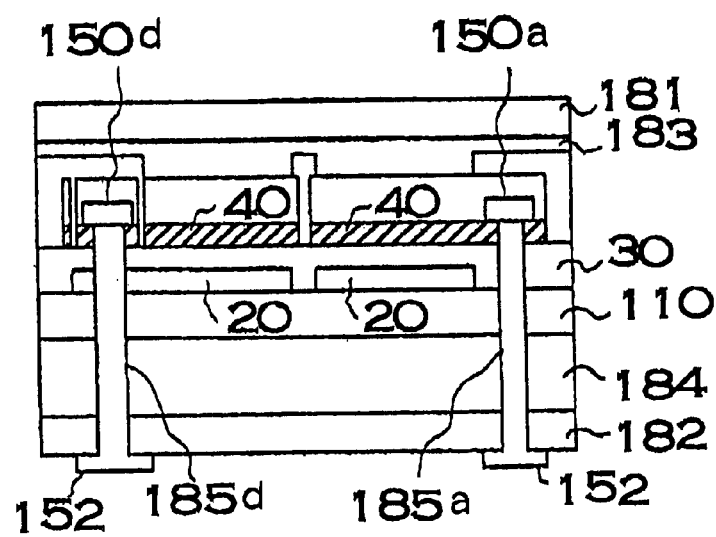

Next, the packing advantage of the above-described photovoltaic device of the present invention is explained. As shown in FIG. 11(b), a uniform stack is realized when a plurality of the completed photovoltaic devices are packed in a cylindrical container 2 having a bottom for shipping or for storage. In the case of the photovoltaic of the first embodiment, as shown in FIG. 11(b), the conducting materials 52 are disposed inside of the opening 85 of the protective resin film 82, so that a plurality of the photovoltaic devices 1 can be superimposed for storage in an approximately parallel relationship. Similarly, in the case of the second embodiment, the devices can be superimposed approximately perpendicular to the axis of the container.

On the contrary, as shown in FIG. 11(a), in the related art photovoltaic devices 3, the conducting materials 152 project from the backside surface of the protective resin film 182 so that the photovoltaic devices 3 incline when superimposed. Therefore, it is difficult to stably store them in the container 2.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A photovoltaic device comprising:
    an insulating substrate defining at least one hole;
    a photovoltaic module disposed on or over said insulating substrate, said photovoltaic module having an output terminal;
    a conducting material formed of conducting paste disposed in the hole of said insulating substrate, said conducting material being electrically connected with the output terminal of the photovoltaic module, said conducting material being extended to a backside of the substrate so that said conducting material includes a backside portion; and
    a protective layer covering the backside of said substrate and defining an opening, wherein the opening is aligned with the hole, and the opening is larger than the backside portion of the conducting material.

2. A photovoltaic device according to claim 1, wherein said insulating substrate is formed of resin material, and said protective layer comprises a resin film.

3. A photovoltaic device according to claim 1, wherein the backside portion of the conducting material is completely recessed in the opening of the protective layer so that the backside portion of the conducting material does not extend to an outer surface of the protective layer.

4. A photovoltaic device according to claim 1, wherein the backside portion of the conducting material is completely recessed in the opening of the protective layer and is spaced therefrom so that the backside portion does not contact the protective layer.

5. A photovoltaic device according to claim 4, wherein the opening is a circular opening and the backside portion of the conducting material is cylindrically-shaped, and the diameter of the opening is greater than the diameter of the backside portion.

6. A method of manufacturing a photovoltaic device, the method comprising:
    forming a hole in an insulating substrate for electrically connecting with an output terminal of a photovoltaic module disposed on or above the insulating substrate;
    forming a conducting material to electrically connect the output terminal of the photovoltaic module, wherein the conducting material is formed of conducting paste, and wherein the conducting material is provided in the hole and on a backside of the substrate; and
    forming a protective layer on the backside of the substrate including forming an opening located at a position corresponding to the location of the conducting material on the backside of the substrate, wherein the opening is larger than the conducting material on the backside of the substrate.

7. A method of manufacturing a photovoltaic device according to claim 6, wherein the substrate is formed of resin material, and the protective layer is a resin film.

8. A method of manufacturing a photovoltaic device according to claim 6, wherein the conducting material is formed by printing and then dry-heating the conducting paste before the protective layer is formed.

* * * * *